United States Patent
Narui (10) Patent No.: US 8,405,179 B2
(45) Date of Patent: Mar. 26, 2013

(54) SOLID-STATE IMAGE SENSING DEVICE

(75) Inventor: Tadashi Narui, Sagamihara (JP)

(73) Assignee: Nokia Corporation, Tokyo (JP)

( * ) Notice: Subject to any disclaimer, the term of this patent is extended or adjusted under 35 U.S.C. 154(b) by 90 days.

(21) Appl. No.: 13/171,945

(22) Filed: Jun. 29, 2011

(65) Prior Publication Data
US 2012/0025280 A1 Feb. 2, 2012

(30) Foreign Application Priority Data

Jul. 2, 2010 (JP) ................................ P2010-152510

(51) Int. Cl.
*G02B 6/26* (2006.01)
(52) U.S. Cl. .......................................... 257/432; 385/14
(58) Field of Classification Search .................. 257/432; 385/2, 12, 14
See application file for complete search history.

(56) References Cited

U.S. PATENT DOCUMENTS

| | | | |
|---|---|---|---|
| 6,674,470 | B1 | 1/2004 | Tanaka et al. |
| 7,129,985 | B1 | 10/2006 | Koizumi et al. |
| 2006/0274176 | A1* | 12/2006 | Guidash ........................ 348/300 |
| 2008/0180555 | A1 | 7/2008 | Sato et al. |

FOREIGN PATENT DOCUMENTS

| | | |
|---|---|---|
| JP | A-10-256520 | 9/1998 |
| JP | A-2000-224495 | 8/2000 |
| JP | A-2008-42673 | 2/2008 |
| JP | A-2008-172608 | 7/2008 |
| JP | A-2008-546313 | 12/2008 |
| JP | A-2009-33316 | 2/2009 |
| WO | WO 2006/130518 A1 | 12/2006 |

OTHER PUBLICATIONS

Apr. 10, 2012 Japanese Office Action issued in Japanese Patent Application No. 2010-152510 (with translation).

* cited by examiner

*Primary Examiner* — Thomas L Dickey
(74) *Attorney, Agent, or Firm* — Oliff & Berridge, PLC (57) ABSTRACT

A solid-state imaging device comprises a plurality of pixels that includes a photoelectric conversion portion, a charge-voltage converter that receives the charge and converts the charge to a voltage, an amplifier that outputs a signal corresponding to a potential of the charge-voltage converter, a transfer portion that transfers a charge from the photoelectric conversion portion to the charge-voltage converter, and a reset transistor that resets a potential of the charge-voltage converter; a connection transistor that connects or disconnects the charge-voltage converter of at least one of the pixels and the charge-voltage converter of at least one of the other pixels. A threshold voltage of the connection transistor is higher than a threshold voltage of the reset transistor.

8 Claims, 4 Drawing Sheets

SOLID-STATE IMAGE SENSING DEVICE

CROSS-REFERENCE TO RELATED APPLICATION

Priority is claimed on Japanese Patent Application No. 2010-152510, filed Jul. 2, 2010, the disclosures of which are hereby incorporated herein by references in their entireties.

BACKGROUND

1. Technical Field

The present invention relates to a solid-state image sensing device.

2. Background Art

Published Japanese Translation No. 2008-546313 of the PCT International Publication discloses a solid-state imaging device that comprises a plurality of pixels, at least two of pixels each having (a) a photodetector, (b) a charge-voltage conversion region that configures a floating capacity portion and (c) an input to an amplifier, and a connection transistor that configures a switch for selectively connecting between the charge-voltage conversion regions.

According to the conventional solid-state imaging device, the connection transistor is turned on, whereby it is possible to perform a pixel mixing (charge-domain binning) that read out a charge of the photodetector of the at least two of pixels with mixing. Additionally, the connection transistor is turned off, whereby, similar to a usual solid-state imaging device not having the connection transistor, it is possible to perform to read out a charge of the photodetector of the at least two of pixels without mixing.

Results of the study of the inventors, in the conventional solid-state imaging device, find out that an image quality of the captured image is reduced due to generation of a leak current via the connection transistor turned off. Namely, in the conventional solid-state imaging device, when the connection transistor is turned off, a charge of the charge-voltage conversion region of an adjacent pixel, which is supposed to be blocked by the connection transistor, flows as leak current into the charge-voltage conversion region of the pixel where a signal is to be read out via the connection transistor. As a result, the image quality is reduced due to generation of a white floating or a noise in the image caused by the leak current.

It is an object of aspects of the present invention to improve an image quality in a solid-state imaging device that includes a connection transistor that connects or disconnects floating capacity portions.

SUMMARY

According to an aspect of the present invention, a solid-state imaging device comprises a plurality of pixels that includes a photoelectric conversion portion that generates and accumulates a charge corresponding to an incident light, a charge-voltage converter that receives the charge and converts the charge to a voltage, an output portion that outputs a signal corresponding to a voltage of the charge-voltage converter, a transfer portion that transfers a charge from the photoelectric conversion portion to the charge-voltage converter, and a reset transistor that resets a potential of the charge-voltage converter; a connection transistor that connects or disconnects the charge-voltage converter of at least one of the pixels and the charge-voltage converter of at least one of the other pixels; wherein a threshold voltage of the connection transistor is higher than a threshold voltage of the reset transistor.

In the above-mentioned aspect, an impurity concentration of the connection transistor may be higher than an impurity concentration of the reset transistor.

In the above-mentioned aspect, a channel width of the connection transistor may be narrower than a channel width of the reset transistor.

In the above-mentioned aspect, a channel length of the connection transistor may be longer than a channel length of the reset transistor.

In the above-mentioned aspect, a gate oxide film of the connection transistor may be thicker than a gate oxide film of the reset transistor.

The above-mentioned aspect further comprises a control portion that applies a turn-on voltage and turn-off voltage to the gate of the connection transistor and applies a turn-on voltage and turn-off voltage to the gate of the reset transistor, wherein an absolute value of a potential difference between the turn-on voltage and the turn-off voltage applied to the gate of the connection transistor may differ from an absolute value of a potential difference between the turn-on voltage and the turn-off voltage applied to the gate of the reset transistor.

According to another aspect of the present invention, a solid-state imaging device comprises a plurality of pixels that includes a photoelectric conversion portion that generates and accumulates a charge corresponding to an incident light, a charge-voltage converter that receives the charge and converts the charge to a voltage, an output portion that outputs a signal corresponding to a potential of the charge-voltage converter, a transfer portion that transfers a charge from the photoelectric conversion portion to the charge-voltage converter, and a reset transistor that resets a potential of the charge-voltage converter; a connection transistor that connects or disconnects the charge-voltage converter of at least one of the pixels and the charge-voltage converter of at least one of the other pixels; and a control portion that applies a turn-on voltage and turn-off voltage to the gate of the connection transistor and applies a turn-on voltage and turn-off voltage to the gate of the reset transistor; wherein an absolute value of a potential difference between the turn-on voltage and the turn-off voltage applied to the gate of the connection transistor differs from an absolute value of a potential difference between the turn-on voltage and the turn-off voltage applied to the gate of the reset transistor.

In the above-mentioned aspect, the charge-voltage converter, the output portion and the reset transistor may be shared for each predetermined number that is more than two of the pixels, the charge-voltage converter, the output portion and the reset transistor may not be shared by the at least one pixel and the another at least one pixel.

According to the aspects of the present invention, it is possible to improve the image quality in a solid-state imaging device that includes a connection transistor that connects or disconnects floating capacity portions.

DESCRIPTION OF EMBODIMENTS

Hereinafter, a solid-state imaging device according to the present invention will be described with reference to the accompanying drawings.

[First Embodiment]

Figure 1:
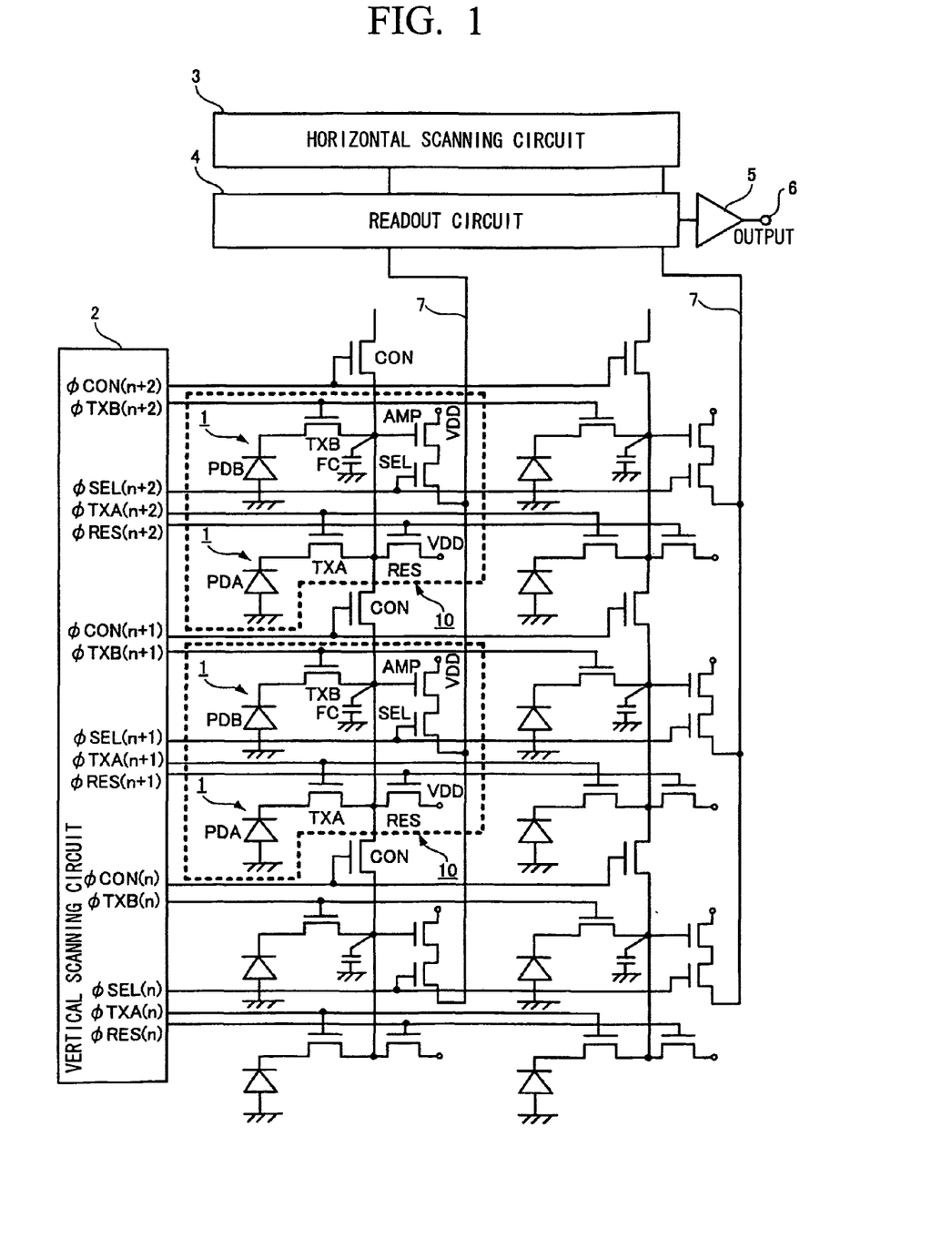
FIG. 1 is a circuit diagram showing a schematic configuration of a solid-state imaging device according to a first embodiment of the present invention.

FIG. 1 is a circuit diagram showing a schematic configuration of a solid-state imaging device according to a first embodiment of the present invention. The solid-state imaging device according to the present embodiment is formed as a CMOS type solid-state imaging device on a silicon substrate by using CMOS processing, and, for example, is mounted in a digital still camera, a video camera or the like.

Figure 2:
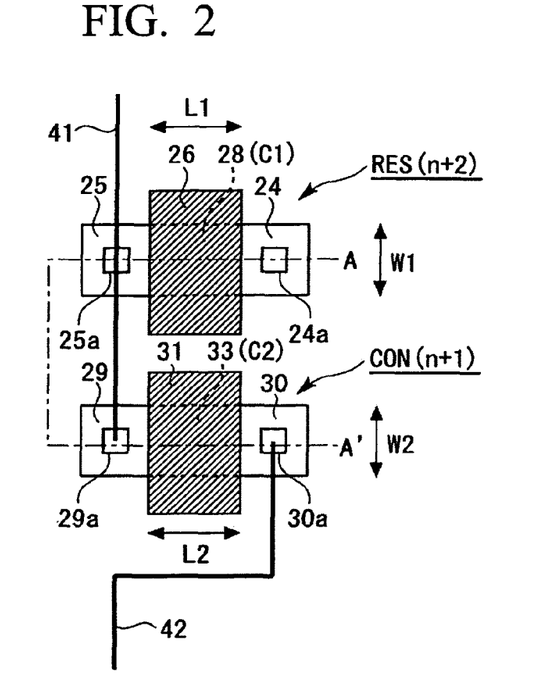
FIG. 2 is a schematic plan view schematically showing a portion of the solid-state imaging device shown in FIG. 1.

The solid-state imaging device according to the present embodiment includes a plurality of pixels 1 arranged in two-dimension (in FIG. 1, shown as 6×2 pixels 1 (3×2 pixel blocks 10)), a vertical scanning circuit 2, a horizontal scanning circuit 3, a readout circuit 4, an output amplifier 5, a vertical signal line 7 which is provided in each column of the pixels 1 and to which an output of the pixel 1 for each column is supplied. An electric signal photoelectrically converted by a photodiode PD of each pixel 1 is acquired by the vertical scanning circuit 2 via the vertical signal line 7 in each row to the readout circuit 4, and the acquired electric signal in the readout circuit 4 is sequentially output to an output terminal 6 by the horizontal scanning circuit 3 via the output amplifier 5 in each column. In FIG. 1 and FIG. 2, "VDD" is a source voltage.

In the present embodiment, each pixel 1 includes a photodiode PD as a photoelectric conversion portion that generates and accumulates a charge corresponding to an incident light, a floating capacity portion FC as a charge-voltage converter that receives the charge and converts the charge to a voltage, an amplification transistor AMP as an output portion (hereinafter arbitrarily called an amplification portion) that outputs a signal corresponding to a potential of the floating capacity portion FC, a transfer transistor TX as a transfer portion that transfers a charge from the photodiode PD to the floating capacity portion FC, a reset transistor RES that resets a potential of the floating capacity portion FC, a selection transistor SEL, and is connected as shown in FIG. 1. In the present embodiment, all of the transistors AMP, TX, RES, SEL of the pixel 1 are nMOS transistors.

In the present embodiment, for two adjacent pixels 1 in a column direction (a vertical direction), the two pixels 1 share a pair of the floating capacity portions FC, the amplification transistor AMP, the reset transistor RES and the selection transistor SEL. In FIG. 1, the two pixels 1 which share a pair of the floating capacity portion FC, the amplification transistor AMP, the reset transistor RES and the selection transistor SEL are shown as a pixel block 10. Additionally, in FIG. 1, the photodiode PD and the transfer transistor TX of the pixel 1 in the lower side of the pixel block 10 are shown as symbols PDA and TXA, the photodiode PD and the transfer transistor TX of the pixel 1 in the upper side of the pixel block 10 are shown as symbols PDB and TXB. In FIG. 1, "n" indicates a row number of the pixel block 10.

The gate of the transfer transistors TXA, TXB is connected to the control line conducting control signals φTXA, φTXB from the vertical scanning circuit 2 in each row of the pixel block 10. The gate of the reset transistor RES is connected to an control line conducting a control signal φRES from the vertical scanning circuit 2 in each row of the pixel block 10. The gate of the selection transistor SEL is connected to the control line conducting a control signal φSEL from the vertical scanning circuit 2 in each row of the pixel block 10. In FIG. 1, "VDD" is a source voltage.

Additionally, the solid-state imaging device according to the present embodiment includes a connection transistor CON that switches ON or OFF between the floating capacity portions FC of two adjacent pixel blocks 10 in the column direction (switches connecting or disconnecting capacities in the floating capacity portions FC of two adjacent pixel blocks 10 in the column direction). The gate of the connection transistor CON is connected to the control line conducting the control signal φCON from the vertical scanning circuit 2 in each row. The connection transistor CON is turned on, while the control signal φCON is at a high level, so as to electrically connect the floating capacity portions FC of two adjacent pixel blocks 10 in the column direction. On the other hand, the connection transistor CON is turned off, while the control signal φCON is at a low level, so as to electrically disconnect the floating capacity portions FC of two adjacent pixel blocks 10 in the column direction.

The photodiodes PDA, PDB generate and accumulate a charge depending on a light intensity (a light of an object) of an incident light. The transfer transistors TXA, TXB are turned on, while the control signals φTXA, φTXB are at high levels, and transfer the charges accumulated in the photodiodes PDA, PDB to the floating capacity portion FC. The reset transistor RES is turned on, while the control signal φRES is at a high level, so as to reset a potential of the floating capacity portion FC to the source voltage VDD.

In the amplification transistor AMP, the drain thereof is connected to the source voltage VDD, the gate thereof is connected to the floating capacity portion FC, the source thereof is connected to the drain of the selection transistor SEL. The amplification transistor AMP outputs a signal corresponding to a voltage value of the floating capacity portion FC to the selection transistor SEL via the vertical signal line 7. The selection transistor SEL is turned on, while the control signal SEL is at a high level, so as to connect the source of the amplification transistor AMP to the vertical signal line 7.

The vertical scanning circuit 2 configures a control portion that outputs the control signals φSEL, φRES, φTXA, φTXB, φCON and controls the above-mentioned transistors AMP, TXA, TXB, RES, SEL in each row of the pixel block 10. As seen from the previous description, in the present embodiment, the vertical scanning circuit 2 applies a low level signal of the control signal φCON as a turn-off voltage to the gate thereof while the connection transistor CON is turned off, and applies a low level signal of the control signal φRES as the turn-off voltage to the gate thereof while the reset transistor RES is turned off.

In the solid-state imaging device according to the present embodiment, it is possible to read out charges of the photodiodes PDA(n+1), PDB(n+1), PDA(n+2), PDB(n+2) in the two floating capacity portions FC(n+1), FC(n+2) connected by the connection transistor CON(n+1) with mixing, for example, by setting the control signal φCON(n+1) to a high level, turning on the connection transistor CON(n+1) corresponding to the row number and connecting the floating capacity portion FC(n+1) of the pixel block 10 in row number n+1 and the floating capacity portion FC(n+2) of the pixel block 10 in row number n+2, and by simultaneously turning on the transfer transistors TXA(n+1), TXB(n+1) of the pixel block 10 in row number n+1 and the transfer transistors TXA(n+2), TXB(n+2) of the pixel block 10 in row number n+2 in a state where the selection transistor SEL(n+1) of the pixel block 10 in row number n+1 is turned on.

Additionally, in the solid-state imaging device according to the present embodiment, in a state where the control signal φCON in all of rows is a low level (the turn-off voltage) and the connection transistors CON in all of rows are turned off, by the same operation as a usual solid-state imaging device so-called share pixel type solid-state imaging device that has no connection transistor CON, it is possible to read out individual signals of the pixels 1. At this time, the charges of the photodiodes PDA, PDB are converted to voltage by the single floating capacity portion FC (particularly, a capacity having a small capacity value), so even if the received light intensity is small and the charges of the photodiodes PDA, PDB are small, the charges of the photodiodes PDA, PDB are converted to large voltage. Therefore, when the received light intensity is small, it is possible to read out a signal with high S/N ratio.

Furthermore, in the solid-state imaging device according to the present embodiment, it is possible to individually read out charges of the photodiode PDA(n+1), PDB(n+1) of the pixel block 10 in row number n+1 and the photodiode PDA(n+2), PDB(n+2) of the pixel block 10 in row number n+2 without mixing, for example, by setting the control signal φCON(n+1) to a high level, turning on the connection transistor CON (n+1) corresponding to the row number and connecting the floating capacity portion FC(n+1) of the pixel block 10 in row number n+1 and the floating capacity portion FC(n+2) of the pixel block 10 in row number n+2, and by sequentially switching turning on the transfer transistors TXA(n+1), TXB (n+1) of the pixel block 10 in row number n+1 and turning on the transfer transistors TXA(n+2), TXB(n+2) of the pixel block 10 in row number n+2, and once turning on the reset transistor RES of the pixel block 10 in row number n+1 and/or n+2 before turning on the transfer transistor TXA, TXB corresponding to the row number in a state where the selection transistor SEL(n+1) of the pixel block 10 in row number n+1 is turned on. At this time, the charges of the photodiode PDA(n+1), PDB(n+1) of the pixel block 10 in row number n+1 and the photodiode PDA(n+2), PDB(n+2) of the pixel block 10 in row number n+2 are converted to a voltage by the two floating capacity portions FC(n+1), FC(n+2) (particularly, a capacity having a large capacity value) connected via the connection transistor CON(n+1). Thus, even if the received light intensity is large and a charge amount of the photodiodes PDA, PDB are large, they are converted to a relatively small voltage. Therefore, when the received light intensity is large, it is possible to prevent the converted signal voltage from becoming too large and the amplification transistor AMP from saturating, and whereby it is possible to expand a dynamic range.

Figure 3:
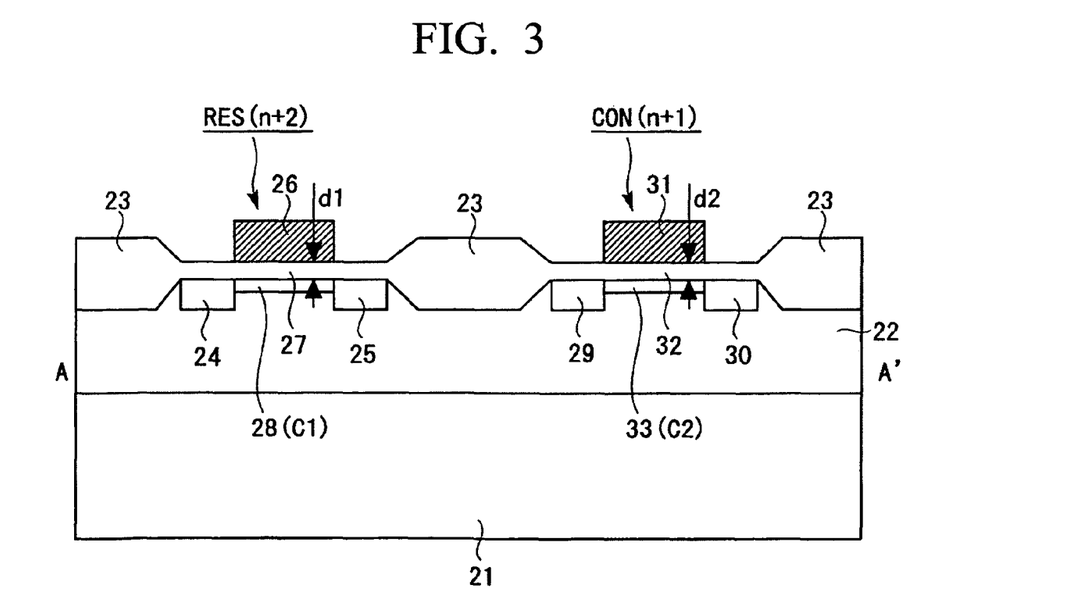
FIG. 3 is a schematic cross-section diagram along the A-A' line in FIG. 2.

FIG. 2 is, as a part of the solid-state imaging device according to the present embodiment, a schematic plane view schematically showing the reset transistor RES(n+2) of the pixel block 10 in row number n+2 in FIG. 1 and the connection transistor CON(n+1) that connects or disconnects between the floating capacity portion FC(n+1) of the pixel block 10 in row number n+1 and the floating capacity portion FC(n+2) of the pixel block 10 in row number n+2. FIG. 3 is a schematic cross-section diagram along the A-A' line in FIG. 2. In FIG. 2, wires that are for supplying the control signal φRES(n+2), φCON(n+1) and a wire of the electric source VDD are omitted. Further, the other reset transistor RES and the other connection transistor CON are also configured similar to FIG. 2 and FIG. 3.

In the present embodiment, a P-type well 22 is provided on an N-type silicon substrate 21, each element in pixel portions such as the reset transistor RES and the photodiodes PDA, PDB (not shown in FIG. 2 and FIG. 3), and the connection transistor CON are arranged in the P-type well 22. Each of the pixels 1 are isolated by a thick silicon oxide film 23 by LOCOS and a separative diffusion (not shown) arranged therebelow as needed. A region where the thick silicon oxide film 23 is not formed is an active region.

Each of the reset transistors RES is a nMOS transistor that has an N-type impurity diffusion region 24 that configures a drain, an N-type impurity diffusion region 25 that configures a source, a gate electrode 26 made of polysilicon, a gate oxide film 27 configured in a relatively-thin silicon oxide film and a channel 28 configured in a P-type semiconductor region. The channel 28 may be a region where the P-type well 22 is directly continued, a P-type impurity concentration C1 of the channel 28 may be the same as a P-type impurity concentration of the P-type well 22. The control signal φRES is applied to the gate electrode 26. The diffusion region 24 is connected to a source wiring (not shown) that applies the source voltage VDD. In FIG. 2, "24a" shows a contact portion with the source wiring in the diffusion region 24, "25a" shows a contact portion with the wire 41 in the diffusion region 25.

Each of the connection transistors CON is nMOS transistor that has an N-type impurity diffusion region 29 that configures one of the source and the drain, an N-type impurity diffusion region 30 that configures another of the source and the drain, a gate electrode 31 made of polysilicon, a gate oxide film 32 configured in a relatively-thin silicon oxide film and a channel 33 configured in a P-type semiconductor region. The channel 33 is a P-type semiconductor region. The control signal φCON is applied to the gate electrode 31. In FIG. 2, "29a" shows a contact portion with the wire 41 in the diffusion region 29, "30a" shows a contact portion with the wire 42 in the diffusion region 30.

The other transistors are also configured similar to the reset transistor RES and the connection transistor CON (not shown in the Figures). The diffusion region 25 of the reset transistor RES(n+2) and the diffusion region 29 of the connection transistor CON(n+1) is connected by the wire 41 to each of the N-type impurity diffusion regions (not shown) that are configuring the drains of the transfer transistors TXA(n+2), TXB (n+2) of the pixel block 10 in row number n+2, the diffusion region 30 (not shown) of the connection transistor CON(n+2) and the gate electrode of the amplification transistor AMP(n+2) (not shown). The floating capacity portion FC(n+2) of the pixel block 10 in row number n+2 are configured by these diffusion regions and the wire 41. Similarly, the diffusion region 30 of the connection transistor CON(n+1) is connected by the wire 42 to the diffusion region 25 (not shown) of the reset transistor RES(n+1), the diffusion region 29 (not shown) of the connection transistor CON(n), each of the N-type impurity diffusion regions (not shown) that configures the drain of the transfer transistor TXA(n+1), TXB(n+1) of the pixel block 10 in row number n+1, and the gate electrode of the amplification transistor AMP(n+1) (not shown). The floating capacity portion FC(n+1) of the pixel block 10 in row number n+1 is configured by these diffusion regions and the wire 42.

Then, in the present embodiment, the P-type impurity concentration C2 of the channel 33 of each of the connection transistors CON is higher than the P-type impurity concentration C1 of the channel 28 of each of the reset transistors RES. Whereby, a threshold voltage Vth2 of each of the connection transistors CON is higher than a threshold voltage Vth1 of each of the reset transistors RES. For example, Vth2=1.1V and Vth1=1.0V. Further, in the present embodiment, the width W2 and the length L2 of the channel 33 of each of the connection transistors CON are the same as the width W1 and the length L1 of the channel 28 of each of the reset transistors RES, and the thickness d2 of the gate oxide film 32 of each of the connection transistors CON is the same as the thickness d1 of the gate oxide film 27 of each of the reset transistors RES.

Here, for facilitating understanding, in the above-mentioned operations, in a state where the control signal φCON in all of the rows is of the low level (the turn-off voltage) and the connection transistor CON in all of the rows is turned off, an operation that reads out a signal of the individual pixel 1 by an operation similar to the usual solid-state imaging device so-called share pixel type solid-state imaging device that does not have the connection transistor CON will be described. In this operation case, the floating capacity portion FC of the pixel block 10 which is to perform reading out is set to a reset potential (the source voltage VDD) by a reset operation by the reset transistor RES of the pixel block 10. However, the floating capacity portion FC of the pixel block 10 neighboring the pixel block 10 which performs a signal readout may have a potential near a ground potential since the floating capacity portion FC is not reset.

At this time, similar to the conventional solid-state imaging device, if the threshold voltage Vth2 of the connection transistor CON and the threshold voltage Vth1 of the reset transistor RES are the same, the charge residing in the floating capacity portion FC of the neighboring pixel block 10 flows as a leak current into the floating capacity portion FC of the pixel block 10, which performs the signal readout, via the connection transistor CON that is turned off. As a result, a white floating and a noise in an image are generated by the leak current, and the image quality is reduced. The defects as described above are generated as well in a position where the connection transistor CON is turned off even when an operation (a connection operation) which turns on the connection transistor CON of a part of the rows is performed.

On the other hand, in the present embodiment, the threshold voltage Vth2 of the connection transistor CON is higher than the threshold voltage Vth1 of the reset transistor RES, thus even if a potential situation where the leak current generates occurs in the connection transistor CON that is turned off, the charge residing in the floating capacity portion FC of the neighboring pixel block 10 is discharged to the electric source VDD through the reset transistor RES of the pixel block 10, whereby the leak current through the connection transistor CON that is turned off is reduced or not generated. Therefore, according to the present embodiment, the white floating and the noise in an image are reduced and the image quality is improved.

[Second Embodiment]

Figure 4:
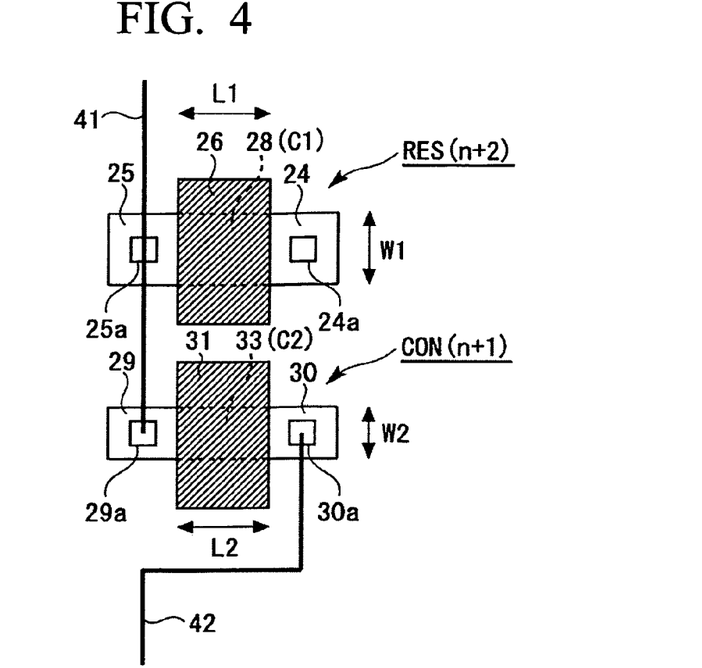
FIG. 4 is a schematic plan view schematically showing a portion of a solid-state imaging device according to a second embodiment of the present invention.

FIG. 4 is a schematic plane view schematically showing a part of a solid-state imaging device according to the second embodiment of the present invention and corresponds to FIG. 2. In FIG. 4, components that are the same as or similar to FIG. 2 are denoted by the same reference symbols, and their description is simplified or omitted.

The difference between the present embodiment and the first embodiment is that in the first embodiment, a relationship between the P-type impurity concentration C1 of the reset transistor RES channel 28 and the P-type impurity concentration C2 of the connection transistor CON channel 33 is C2>C1, and in the present embodiment, the relationship is C2=C1. The other difference is that in the first embodiment, a relationship between the width W1 of the channel 28 of the reset transistor RES and the width W2 of the channel 33 of the connection transistor CON is W2=W1, and in the present embodiment, the width W2 of the channel 33 of each of the connection transistors CON is narrower than the width W1 of the channel 28 of each of the reset transistors RES. By setting W2<W1, due to the Narrow channel effect, the threshold voltage Vth2 of each of the connection transistors CON is higher than the threshold voltage Vth1 of each of the reset transistors RES. For example, W2=0.8 μm and W1=1.0 μm.

According to the present embodiment, since Vth2>Vth1, the advantages similar to the first embodiment are also obtained.

[The Third Embodiment]

Figure 5:
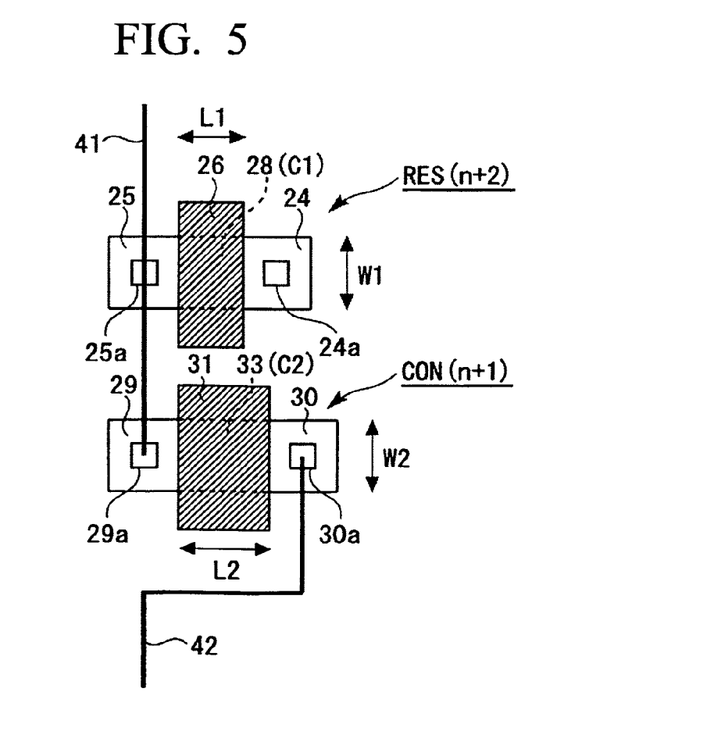
FIG. 5 is a schematic plan view schematically showing a portion of a solid-state imaging device according to a third embodiment of the present invention.

FIG. 5 is a schematic plane view schematically showing a part of a solid-state imaging device according to the third embodiment of the present invention and corresponds to FIG. 2. In FIG. 5, components that are the same as or similar to FIG. 2 are denoted by the same reference symbols, and their description is simplified or omitted.

The difference between the present embodiment and the first embodiment is that in the first embodiment, a relationship between the P-type impurity concentration C1 of the channel 28 of the reset transistor RES and the P-type impurity concentration C2 of the channel 33 of the connection transistor CON is C2>C1, and in the present embodiment, C2=C1. The other difference is that in the first embodiment, a relationship between the length L1 of the channel 28 of the reset transistor RES and the length L2 of the channel 33 of the connection transistor CON is L2=L1, and in the present embodiment, the length L2 of the channel 33 of each of the connection transistors CON is longer than the length L1 of the channel 28 of each of the reset transistors RES. By setting L2>L1, due to the Short channel effect, the threshold voltage Vth2 of each of the connection transistors CON is higher than the threshold voltage Vth1 of each of the reset transistors RES. For example, L2=1.2 μm and W1=1.0 μm.

According to the present embodiment, since Vth2>Vth1, the advantages similar to the first embodiment are also obtained.

[Fourth Embodiment]

Figure 6:
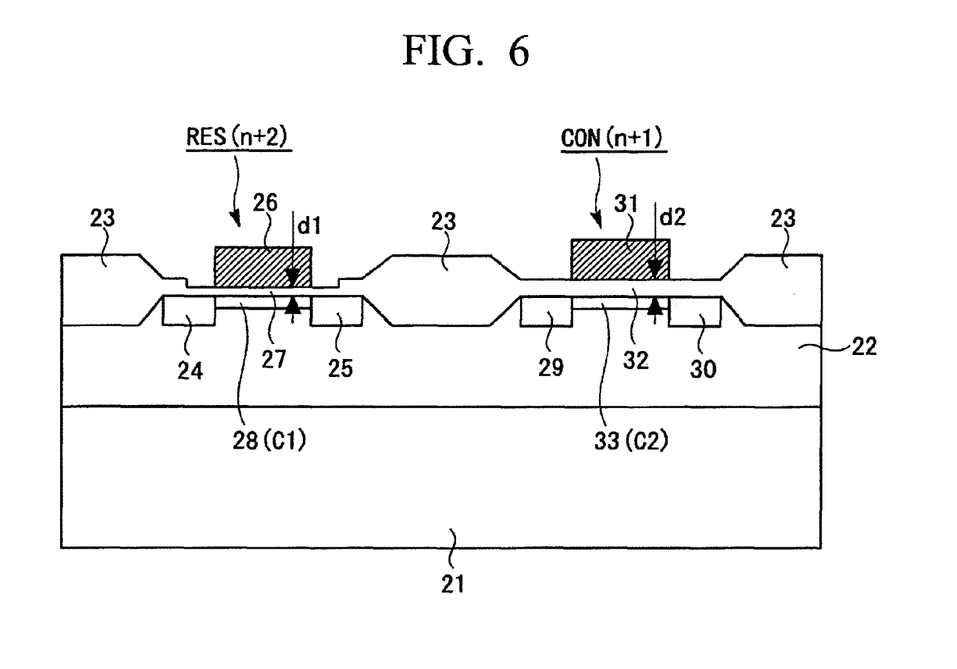
FIG. 6 is a schematic cross-section diagram schematically showing a portion of a solid-state imaging device according to a fourth embodiment of the present invention.

FIG. 6 is a schematic cross-section diagram schematically showing a part of a solid-state imaging device according to the fourth embodiment of the present invention and corresponds to FIG. 3. In FIG. 6, components that are the same as or similar to FIG. 3 are denoted by the same reference symbols, and their description is simplified or omitted.

The difference between the present embodiment and the first embodiment is that in the first embodiment, a relationship between the P-type impurity concentration C1 of the channel 28 of the reset transistor RES and the P-type impurity concentration C2 of the channel 33 of the connection transistor CON is C2>C1, and in the present embodiment, C2=C1. The other difference is that in the first embodiment, a relationship between the thickness d1 of the gate oxide film 27 of the reset transistor RES and the thickness d2 of the gate oxide film 32 of the connection transistor CON is d2=d1, and in the present embodiment, the thickness d2 of the gate oxide film 32 of each of the connection transistors CON is thicker than the thickness d1 of the gate oxide film 27 of each of the reset transistors RES. By setting d2>d1, the threshold voltage Vth2 of each of the connection transistors CON is higher than the threshold voltage Vth1 of each of the reset transistors RES. For example, d2=20 nm and d1=15 nm.

According to the present embodiment, since Vth2>Vth1, the advantages similar to the first embodiment are also obtained.

Furthermore, in the first through fourth embodiments, as previously mentioned, Vth2>Vth1 is obtained by satisfying only one of the following conditions: C2>C1, L2>L1, W2<W1 and d2>d1. However, in the present invention, Vth2>Vth1 may be obtained by satisfying two or more of those conditions.

[Fifth Embodiment]

The difference between a solid-state imaging device according to the fifth embodiment of the present invention and the solid-state imaging device according to the first embodiment is that in the first embodiment, a relationship between the P-type impurity concentration C1 of the reset transistor RES channel 28 and the P-type impurity concentration C2 of the channel 33 of the connection transistor CON is C2>C1 whereby Vth2>Vth1, and in the present embodiment, C2=C1 whereby Vth2=Vth1. The other difference is that in the first embodiment, the vertical scanning circuit 2 are configured to supply voltages where the turn-on voltage, the turn-off voltage of the control signal φCON that is applied to the gate of the connection transistor CON and the turn-on voltage, the turn-off voltage of the control signal φRES that is applied to the gate of the reset transistor RES are the same level voltages, and in the present embodiment, the vertical scanning circuit 2 is configured to supply voltages where the turn-on voltages are the same level and the turn-off voltages are a different level.

In the present embodiment, the vertical scanning circuit 2 applies the turn-off voltage, which is displaced (shifted) to an opposite direction with respect to a direction where the connection transistor CON is turned on (a positive or negative direction of voltage) from a voltage the same as the turn-off voltage which is applied to the gate of the reset transistor RES, to the gate of the connection transistor CON. Specifically, in the present embodiment, the connection transistor CON and the reset transistor RES are nMOS transistors. Therefore, for example, the turn-off voltage of the reset transistor RES is 0V and the turn-off voltage of the connection transistor CON is minus (−) 1V displaced from 0V to the negative direction. In this manner, the levels of the turn-on voltage and the turn-off voltage are set so that the absolute value of a potential difference between the turn-on voltage and the turn-off voltage which are applied to the gate of the connection transistor is different from (for example, is larger than) the absolute value of a potential difference between the turn-on voltage and the turn-off voltage which are applied to the gate of the reset transistor.

Therefore, in the present embodiment, the connection transistor CON is maintained in a deeper off-state than the reset transistor RES in a manner. For this reason, according to the present embodiment, despite the fact that Vth2=Vth1, even if the potential situation where the leak current is generated occurs in the connection transistor CON that is turned off, the charge residing in the floating capacity portion FC of the neighboring pixel block 10 is discharged to electric source VDD through the reset transistor RES of the pixel block 10, whereby the leak current through the connection transistor CON that is turned off is reduced or not generated. Therefore, according to the present embodiment, similar to the first embodiment, the white floating and the noise of the image are reduced and the image quality is improved. Furthermore, Vth2>Vth1 may be obtained similar to the first through the fourth embodiments and the turn-off voltages of the connection transistor CON and the reset transistor RES may be set similar to the present embodiment. In this case, the leak current can be further reduced and the image quality can be further improved.

Above, each embodiment of the present invention has been described, however, the present invention is not limited to these embodiments.

In each embodiment, as previously mentioned, for two pixels 1 neighboring in the column direction, the two pixels 1 share a pair of the floating capacity portions FC, the amplification transistor AMP, the reset transistor RES and the selection transistor SEL. However, in the present invention, for example, for a predetermined number that is more than three of the pixels 1 neighboring in the column direction, the predetermined number of pixels 1 may share a pair of the floating capacity portions FC, the amplification transistor AMP, the reset transistor RES and the selection transistor SEL.

Additionally, the present invention may be applied to not only the share pixel type solid-state imaging device but a solid-state imaging device wherein each of pixels individually has the floating capacity portion FC, the amplification transistor AMP, the reset transistor RES and the selection transistor SEL without sharing.

Additionally, in the above-mentioned embodiments, the case where all of the transistors AMP, TX, RES, SEL in the pixel 1 are nMOS transistors has been described. Alternatively or additionally, the solid-state imaging device may have at least one of pMOS transistors. For example, all of the transistors AMP, TX, RES, SEL of the pixel 1 may be the pMOS transistors.

What is claimed is:

1. A solid-state imaging device comprising:
a plurality of pixels that includes a photoelectric conversion portion that generates and accumulates a charge corresponding to an incident light, a charge-voltage converter that receives the charge and converts the charge to a voltage, an output portion that outputs a signal corresponding to a voltage of the charge-voltage converter, a transfer portion that transfers a charge from the photoelectric conversion portion to the charge-voltage converter, and a reset transistor that resets a potential of the charge-voltage converter;
a connection transistor that connects or disconnects the charge-voltage converter of at least one of the pixels and the charge-voltage converter of at least one of the other pixels;
wherein a threshold voltage of the connection transistor is higher than a threshold voltage of the reset transistor.

2. The solid-state imaging device according to claim 1, wherein an impurity concentration of the connection transistor is higher than an impurity concentration of the reset transistor.

3. The solid-state imaging device according to claim 1, wherein a channel width of the connection transistor is narrower than a channel width of the reset transistor.

4. The solid-state imaging device according to claim 1, wherein a channel length of the connection transistor is longer than a channel length of the reset transistor.

5. The solid-state imaging device according to claim 1, wherein a gate oxide film of the connection transistor is thicker than a gate oxide film of the reset transistor.

6. The solid-state imaging device according to claim 1, further comprising: a control portion that applies a turn-on voltage and turn-off voltage to the gate of the connection transistor and applies a turn-on voltage and turn-off voltage to the gate of the reset transistor,
wherein an absolute value of a potential difference between the turn-on voltage and the turn-off voltage applied to the gate of the connection transistor differs from an absolute value of a potential difference between the turn-on voltage and the turn-off voltage applied to the gate of the reset transistor.

7. The solid-state imaging device according to claim 1, wherein the charge-voltage converter, the output portion and the reset transistor are shared for each predetermined number that is more than two of the pixels, the charge-voltage converter, the output portion and the reset transistor are not shared by the at least one pixel and the another at least one pixel.

8. A solid-state imaging device comprising:
a plurality of pixels that includes a photoelectric conversion portion that generates and accumulates a charge corresponding to an incident light, a charge-voltage converter that receives the charge and converts the charge to a voltage, an output portion that outputs a signal corresponding to a potential of the charge-voltage converter, a transfer portion that transfers a charge from the photoelectric conversion portion to the charge-voltage converter, and a reset transistor that resets a potential of the charge-voltage converter;
a connection transistor that connects or disconnects the charge-voltage converter of at least one of the pixels and the charge-voltage converter of at least one of the other pixels; and
a control portion that applies a turn-on voltage and turn-off voltage to the gate of the connection transistor and applies a turn-on voltage and turn-off voltage to the gate of the reset transistor;
wherein an absolute value of a potential difference between the turn-on voltage and the turn-off voltage applied to the gate of the connection transistor differs from an absolute value of a potential difference between the turn-on voltage and the turn-off voltage applied to the gate of the reset transistor.

\* \* \* \* \*

UNITED STATES PATENT AND TRADEMARK OFFICE
CERTIFICATE OF CORRECTION

PATENT NO. : 8,405,179 B2
APPLICATION NO. : 13/171945
DATED : March 26, 2013
INVENTOR(S) : Tadashi Narui It is certified that error appears in the above-identified patent and that said Letters Patent is hereby corrected as shown below:

On the Title Page

Item (73) should read

Assignee: ~~Nokia Corporation~~ Nikon Corporation

Signed and Sealed this
Eleventh Day of June, 2013

Teresa Stanek Rea
*Acting Director of the United States Patent and Trademark Office*